US008316329B1

(12) United States Patent
Rigby et al.

(10) Patent No.: US 8,316,329 B1
(45) Date of Patent: Nov. 20, 2012

(54) RETICLE AND TECHNIQUE FOR MULTIPLE AND SINGLE PATTERNING

(75) Inventors: Rodney Rigby, Riverton, UT (US); James Frisby, Lehi, UT (US); Aaron Parr, Sandy, UT (US); Yasuhisa Yamamoto, Kanagawa (JP)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/974,168

(22) Filed: Dec. 21, 2010

Related U.S. Application Data

(62) Division of application No. 11/845,753, filed on Aug. 27, 2007, now Pat. No. 7,879,537.

(51) Int. Cl.
*G06F 17/50* (2006.01)
*G06F 19/00* (2011.01)

(52) U.S. Cl. .............................. 716/55; 716/51; 700/121

(58) Field of Classification Search .............. 716/50–56; 430/5; 700/120–121; 382/144–145
See application file for complete search history.

(56) References Cited

U.S. PATENT DOCUMENTS

| | | | |
|---|---|---|---|
| 5,250,983 A | 10/1993 | Yamamura | |
| 5,998,068 A | 12/1999 | Matsuoka | |
| 6,114,072 A | 9/2000 | Narimatsu | |
| 6,436,589 B1 | 8/2002 | Smith | |
| 6,737,205 B2 | 5/2004 | Maltabes et al. | |
| 6,861,180 B2 | 3/2005 | Chang | |
| 7,392,502 B2 * | 6/2008 | Percin et al. | 716/53 |
| 7,972,755 B2 * | 7/2011 | Yamamoto | 430/30 |
| 8,071,278 B1 * | 12/2011 | Yamamoto | 430/394 |
| 2005/0042529 A1 | 2/2005 | Rumsey et al. | |
| 2005/0125763 A1 * | 6/2005 | Lin et al. | 716/21 |
| 2005/0164096 A1 | 7/2005 | Hong et al. | |
| 2006/0003234 A1 * | 1/2006 | Woolaway et al. | 430/5 |
| 2006/0019173 A1 * | 1/2006 | Yamamoto | 430/5 |
| 2006/0097356 A1 | 5/2006 | Fujii et al. | |
| 2010/0151364 A1 * | 6/2010 | Ye et al. | 430/5 |

OTHER PUBLICATIONS

Hand et al., "Double Patterning Wrings More From Immersion Lithography," http://www.reed-electronics.com/semiconductor/index.asp?layout=articlePrint&articleID=CA640 . . . , Feb. 27, 2007, pp. 1-5.

* cited by examiner

*Primary Examiner* — Stacy Whitmore
(74) *Attorney, Agent, or Firm* — Holland & Knight LLP; Brian J. Colandreo, Esq.; Mark H. Whittenberger, Esq.

(57) ABSTRACT

Double patterning is achieved with a single reticle while maintaining the integrity of in-scribe patterns and without blading the reticle. In-scribe structures may or may not be double patterning. For example, elements such as electrical test structures might have features that are so closely spaced that double pattering is desired. However, elements such as optical alignment marks might not require double patterning. For those elements for which double patterning is not desired, a first sub-array of the reticle has a pattern for the element, whereas the corresponding location in a second sub-array has a blank. By the corresponding location, it is meant the location on the reticle that would be exposed to the same target region to which the element would be exposed if the reticle were used for double patterning. Thus, the blank prevents target region from being exposed more than once.

7 Claims, 11 Drawing Sheets

RETICLE AND TECHNIQUE FOR MULTIPLE AND SINGLE PATTERNING

CROSS-REFERENCE TO RELATED APPLICATION

This application is a Divisional of U.S. patent application Ser. No. 11/845,753, filed on 27 Aug. 2007, entitled "Reticle and Technique for Multiple and Single Patterning, which is related to application Ser. No. 11/787,619 entitled, "Multiple Patterning Technique Using A Single Reticle", filed by Yamamoto on Apr. 16, 2007. The entire contents of said application are incorporated herein in its entirety.

FIELD OF THE INVENTION

The present invention relates generally to semiconductor fabrication and, more specifically, to multiple and single patterning lithography using a single reticle.

BACKGROUND

In semiconductor processing, a reticle (sometimes referred to as a photomask) is used to form a pattern on a wafer, or more precisely, on a photoresist on the wafer. Typically, the reticle is used in an imaging system that projects an image of a pattern in the reticle onto a target region of the wafer. A reticle often has a "die array" with a small space between adjacent dice in the array. This space between the dice is referred to by various names including scribe lines, scribe lanes, kerfs, and streets. Typically, each die in the array has a pattern that is used to form one layer of an integrated circuit. As the overall circuit design usually has many layers, typically a different reticle is used for each layer. Thus, the pattern in one die on the reticle is transferred to the wafer to form one layer of the integrated circuit.

Just as the patterns in the die array can be transferred from the reticle to the wafer, patterns can be transferred from the reticle scribe line to a wafer scribe line. The patterns in the scribe lines are required for correct processing of the wafer. Herein, the term scribe line may be used to refer to either a scribe line of a reticle or a scribe line of a wafer. The scribe lines have been used for various purposes. For example, test and measurement structures may be formed in the wafer scribe lines by transferring patterns from the reticle scribe lines. As a particular example, a semiconductor test device or test circuit could be formed in the wafer scribe line. After using these test structures to test whether the circuit fabrication process was successful, the test structures are destroyed when the chips are removed from the wafer by, for example, cutting along the wafer scribe lines.

The reticle scribe lines can also be used for process control. For example, a pattern, such as alignment marks or inspection keys, can be transferred from the reticle scribe lines to the wafer scribe lines. The alignment marks can be used to verify that each new layer that is formed on the wafer is precisely aligned with the lower layer. The reticle scribe lines can also contain marks that are used during the manufacture of the reticle itself.

As lithography process technology moves to smaller and more closely spaced features, it becomes more difficult to print the design from the reticle onto the wafer due to resolution limits. A primary limitation is how closely features can be spaced due to optical limitations. This is so even if resolution enhancement techniques (RET) such as optical proximity correction (OPC), immersion scanning, and phase shift masks are employed.

Double patterning is a technique that has been considered to achieve more closely spaced features. In double patterning, two reticles are used to print split portions of an original pattern onto a hard mask that, in turn, is used to transfer the original pattern to the substrate. To print two patterns on the hard mask, the original pattern is split into two or more patterns where each has a narrowest pitch that is wider than the narrowest pitch in the original pattern. Each of the split patterns is printed to a separate reticle. First one reticle is exposed onto a photoresist above the hard mask. The photomask is removed and the pattern is transferred from the hard mask to the wafer. After transferring the first pattern from the photomask to the wafer, a new layer of photoresist is applied to the wafer and another photomask is added above the hard mask. Next, the second reticle is exposed onto the second photoresist. After transferring the second pattern to the hard mask, the second photomask is removed and the second pattern is transferred from the hard mask to the wafer, resulting in the combined pattern being transferred from the two reticles to the wafer.

However, for such a technique to be effective, the exposure of the two split patterns needs to be precisely aligned such that the original pattern is achieved. However, lithography techniques have limitations in how precisely the two patterns can be aligned.

Thus, improved techniques for forming devices, such as semiconductors, having narrow pitches are desired.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings, in which like reference numerals refer to similar elements, and in which.

DETAILED DESCRIPTION OF EMBODIMENTS OF THE INVENTION

Figure 1:
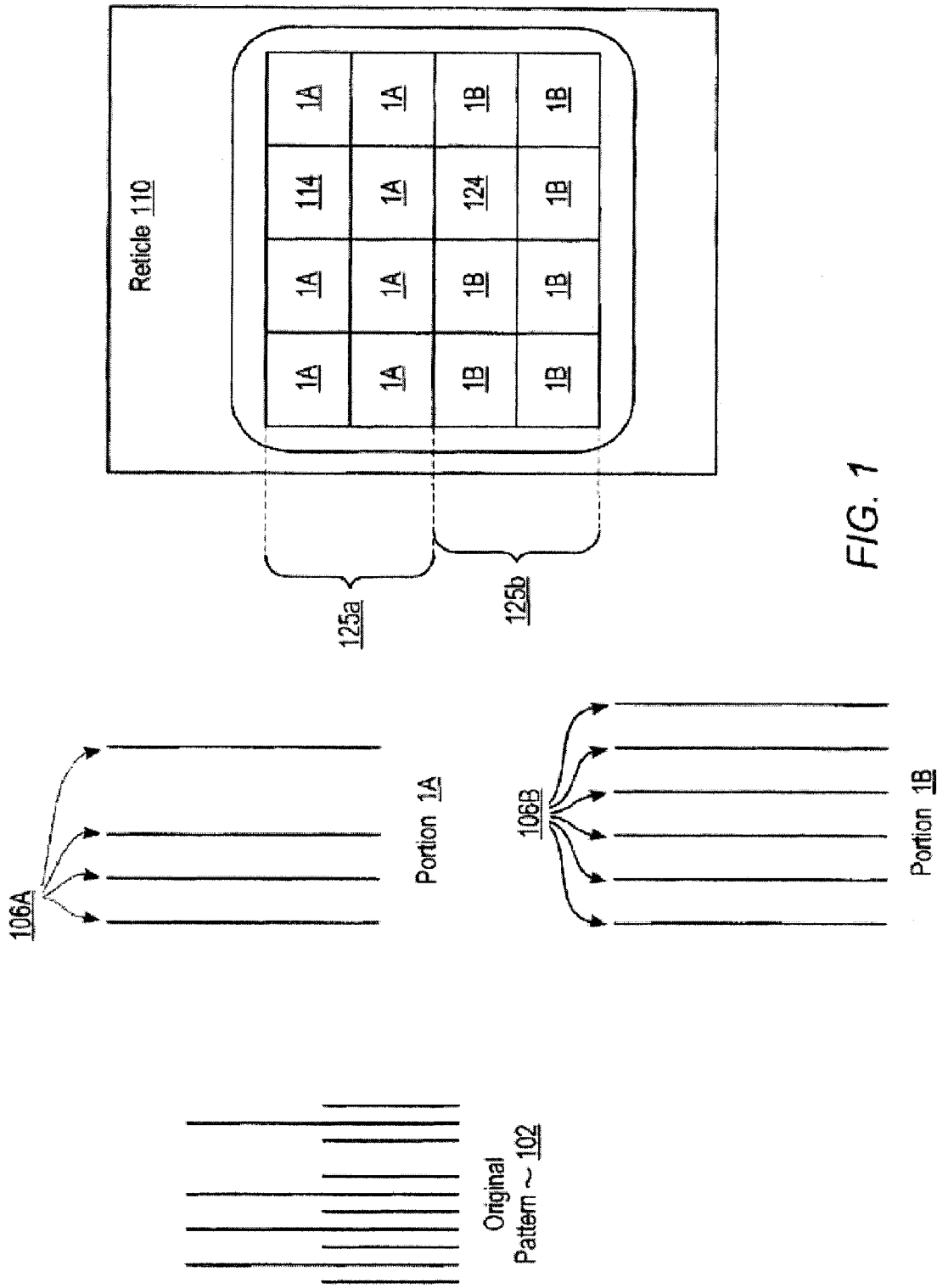
FIG. 1 illustrates a simplified original pattern split into two portions, which are incorporated into a single reticle, according to an embodiment of the invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

Mechanisms are disclosed herein for double and single patterning using a single reticle while maintaining the integrity of in-scribe patterns. In double patterning, an original pattern of a design to be patterned in a target material is split into two portions, each with a narrowest pitch that is wider than the narrowest pitch of the original pattern. Splitting the pattern results in separating features that were interleaved in the original pattern. The two portions are then printed onto a single reticle. However, because the features that were interleaved in the original pattern have been separated, the narrowest pitch in the individual portions has been increased. If desired, OPC can be applied to each portion.

In an embodiment, double patterning is achieved with a single reticle while maintaining the integrity of in-scribe patterns and without blading the reticle to prevent a portion of the reticle from being exposed to the target. However, not all elements are formed using double patterning. For example, elements in the scribe lines may or may not need to be double patterning. As particular examples, elements such as electrical test structures might have features that are so closely spaced that double pattering is desired; however, elements such as optical alignment marks might not require double patterning. Therefore, double patterning is not used for certain features, in an embodiment. Thus, the reticle is configured in a manner to allow double patterning of some elements but not others. Herein, those elements that are not double patterned are referred to as single patterned. Double patterning is used as an example of multiple patterning; therefore, triple patterning, etc. could be performed.

The reticle has a first region having first portions of whatever patterns are to be double patterned and a second region for second portions of the patterns. For example, the first region could have one or more die areas for a first portion of a pattern for a circuit, whereas the second region has one or more die areas for a second portion of the circuit pattern. The first region might also have a scribe line having first portions of a pattern for electrical test structures, whereas the second region has corresponding scribe line for the second portion of the pattern for the electrical test structures.

For those elements for which double patterning is not desired, the first region of the reticle has a pattern for the element, whereas the corresponding location in the second region has a blank. By the corresponding location, it is meant the location on the reticle that would be exposed to the same target region to which the element would be exposed if the reticle were used for double patterning. Thus, the blank prevents the target region from being exposed more than once. That is, a part of the target region that is to be single patterned is exposed during one step of double patterning but not the other step. Furthermore, no blading of the reticle is required. Thus, the entire reticle may be exposed in one step such that throughput is not negatively impacted due to blading a portion of the reticle.

In one embodiment, a reticle that is suitable for both double patterning and single patterning is formed, again while maintaining the integrity of in-scribe patterns. First, a die pattern and in-scribe patterns are received. The die pattern could be for a particular layer of an integrated circuit. In one embodiment, the die pattern is received in two portions, which correspond to different portions for double patterning. In another embodiment, the die pattern is split into two portions, based on an analysis of the features of the die pattern. A determination is made as to which of the in-scribe patterns are to be double patterned. A first sub-array is formed comprising a plurality of the first portions and a second sub-array is formed comprising a plurality of the second portions. Placements are determined in the first sub-array and the second sub-array for split versions of the in-scribe patterns that are to be double patterned. The placements allow double patterning of the in-scribe patterns that are to be double patterned. For each particular in-scribe pattern that is not to be double patterned, a placement is determined in either the first sub-array or the second sub-array for the particular pattern and position for a blank in the other of the first sub-array or the second sub-array. The blank is positioned to prevent a target region from being exposed by more than the particular in-scribe pattern during double patterning of the particular in-scribe pattern. Then, the first sub-array and the second sub-array are merged to generate a file for printing a reticle.

Example Split Pattern and Reticle in Accordance with an Embodiment

FIG. 1 illustrates a simplified original pattern 102, which has features 106a and features 106b. The pattern 102 represents a design that is to be formed in, for example, a wafer. The original pattern 102 is split into portion 1A and portion 1B such that features 106a form the portion 1A and features 106b form portion 1B. Separating features 106a from features 106b results in the narrowest pitch in each of portion 1A and portion 1B being larger than the narrowest pitch in the original pattern 102.

The features 106a and 106b are interleaved in the original pattern 102. By interleaved it is meant that for at least some pairs of adjacent features 106b, there is at least one feature 106a therebetween. Therefore, removing the feature 106a increases the width of the pitch between the pair of adjacent features 106b in portion 1B relative to the pitch between the adjacent features of 106a and 106b in the original pattern 102. It is not required that all pairs of adjacent features 106b in the original pattern 102 have a feature 106a therebetween. Likewise, at least some pairs of adjacent features 106a in the original pattern 102 may have a feature 106b therebetween. However, it is not required that all pairs of adjacent features 106a in the original pattern 102 have a feature 106b therebetween.

A reticle 110 in accordance with an embodiment of the present invention has at least one instance of portion 1A and at least one instance of portion 1B. The example reticle 110 has eight instances of portion 1A in a first "sub-array" 125a and eight instances of portion 1B in a second sub-array 125b. In an embodiment, each portion 1A (and each portion 1B) corresponds to a single die. By controlling exposure of each sub-array 125a, 125b over, for example, a wafer, double patterning can be achieved.

However, somewhere on the reticle 110 there may be elements for which double patterning is not desired or needed.

As an example, double patterning may not be desired for certain in-scribe elements. However, there could be elements that are not in a scribe line for which double patterning is not desired. For elements for which double patterning is not desired, the example reticle 110 has a pattern 114 in one of sub-arrays (e.g., 125*a*) and a blank 124 in a corresponding location in the other sub-array (e.g., 125*b*). If the reticle 110 is used to separately expose sub-array 125*a* and 125*b* in a double patterning process, the pattern 144 and the blank 124 are in positions such that they should each expose the same target region. However, the blank 124 prevents the target region from being exposed a second time. Thus, only the pattern 114 is exposed to the target region. The blank 124 could be chrome or some other material that blocks exposure of the reticle to the target region.

Example Reticle in Accordance with an Embodiment

Figure 2:
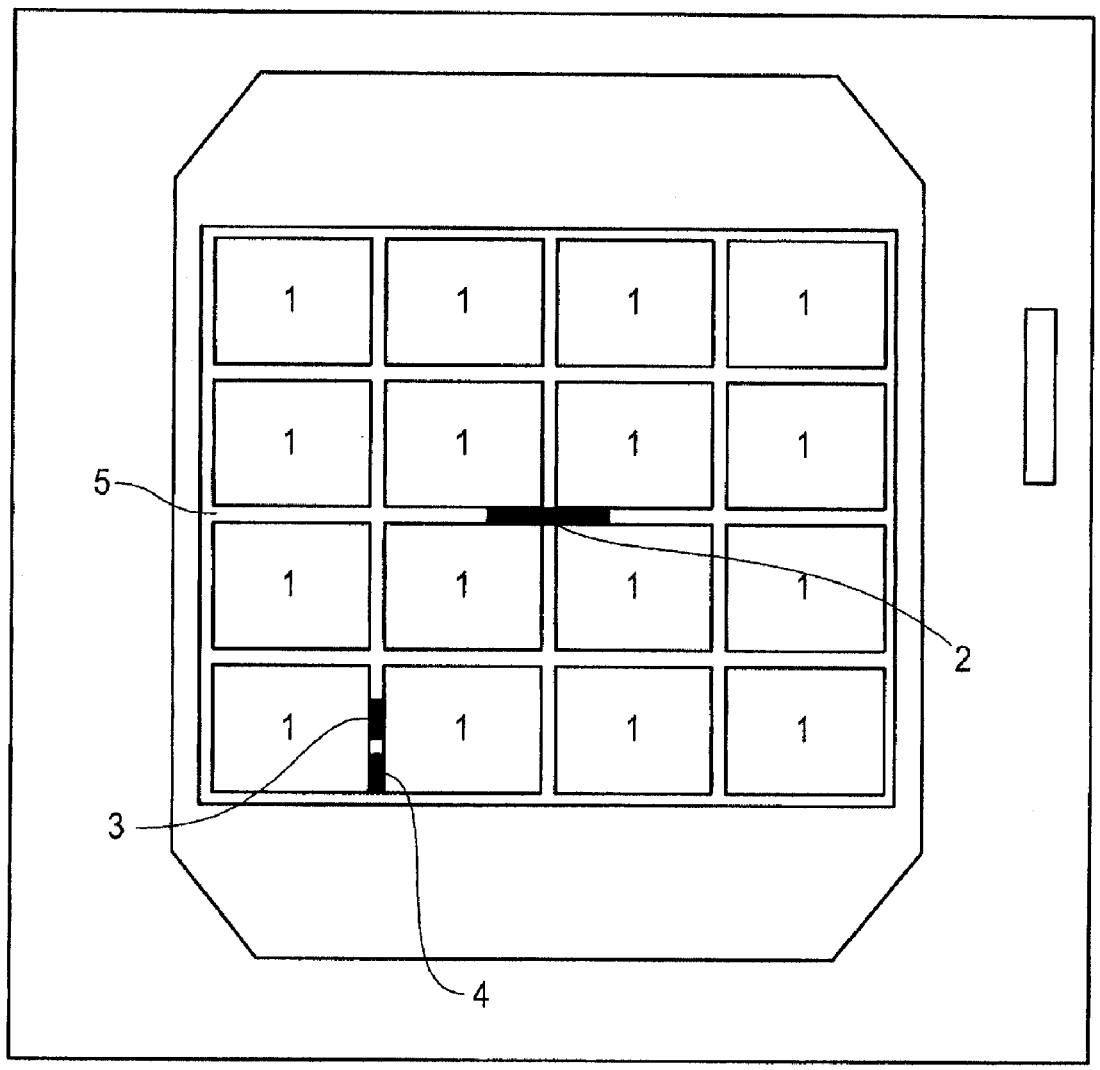
FIG. 2 illustrates an example reticle that is not configured for double patterning.

FIG. 2 illustrates an example reticle 210 that is not configured for double patterning. The reticle 210 has a 4×4 die array in which each die has the same pattern 1. Moreover, the pattern 1 in each die is not a split portion. The scribe lines 5 contain test structure patterns 3, 4, which when transferred to the wafer are used to form at least a portion of electrical test structures. For example, one layer of a semiconductor circuit could be formed with test structure pattern 3. The scribe lines 5 also contain process control patterns 2, which are used for process control. As an example, process control pattern 2 can be transferred to the wafer to form an alignment mark that is used to control alignment of reticles used to form higher layers. A process control pattern 2 might also be used to assist in the formation of the reticle 210 itself. The patterns 2, 3, 4 can be in either the horizontal or vertical scribe lines. Moreover, any number of these patterns 2, 3, 4 could be present.

Figure 3:
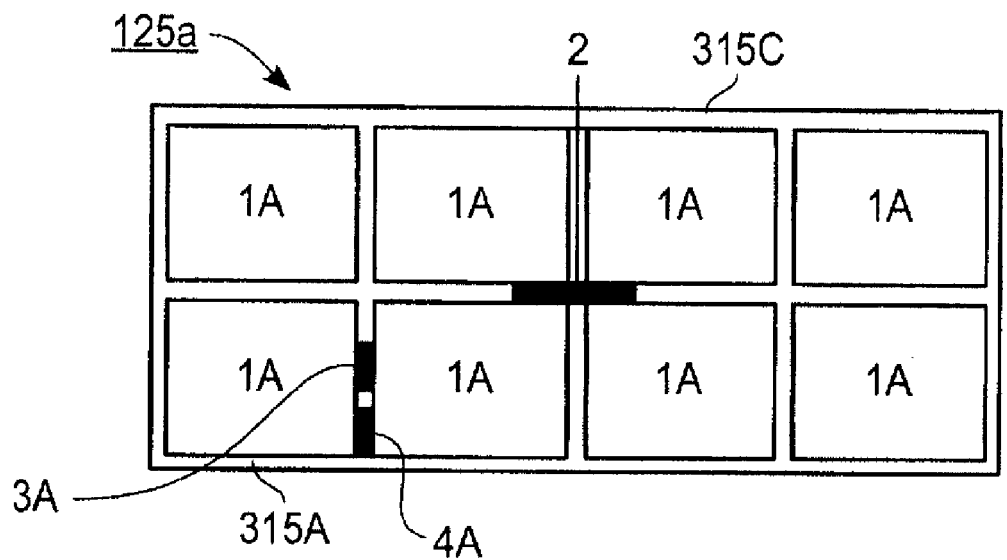
FIG. 3 depicts two sub-arrays that can be merged to form the framework of a single reticle that is used for double patterning, in accordance with an embodiment.
Figure 3:
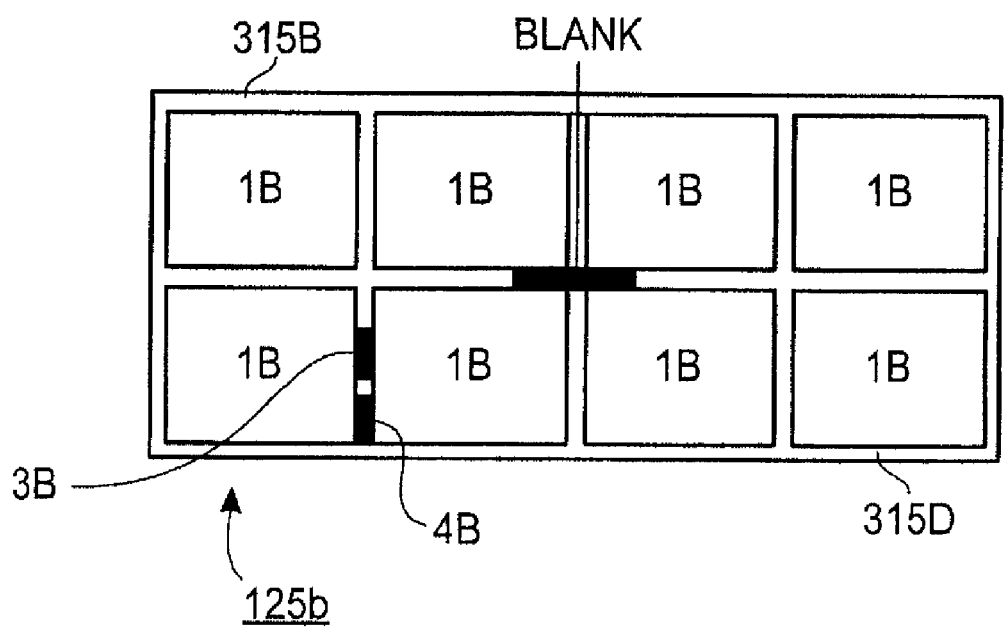
Figure 4:
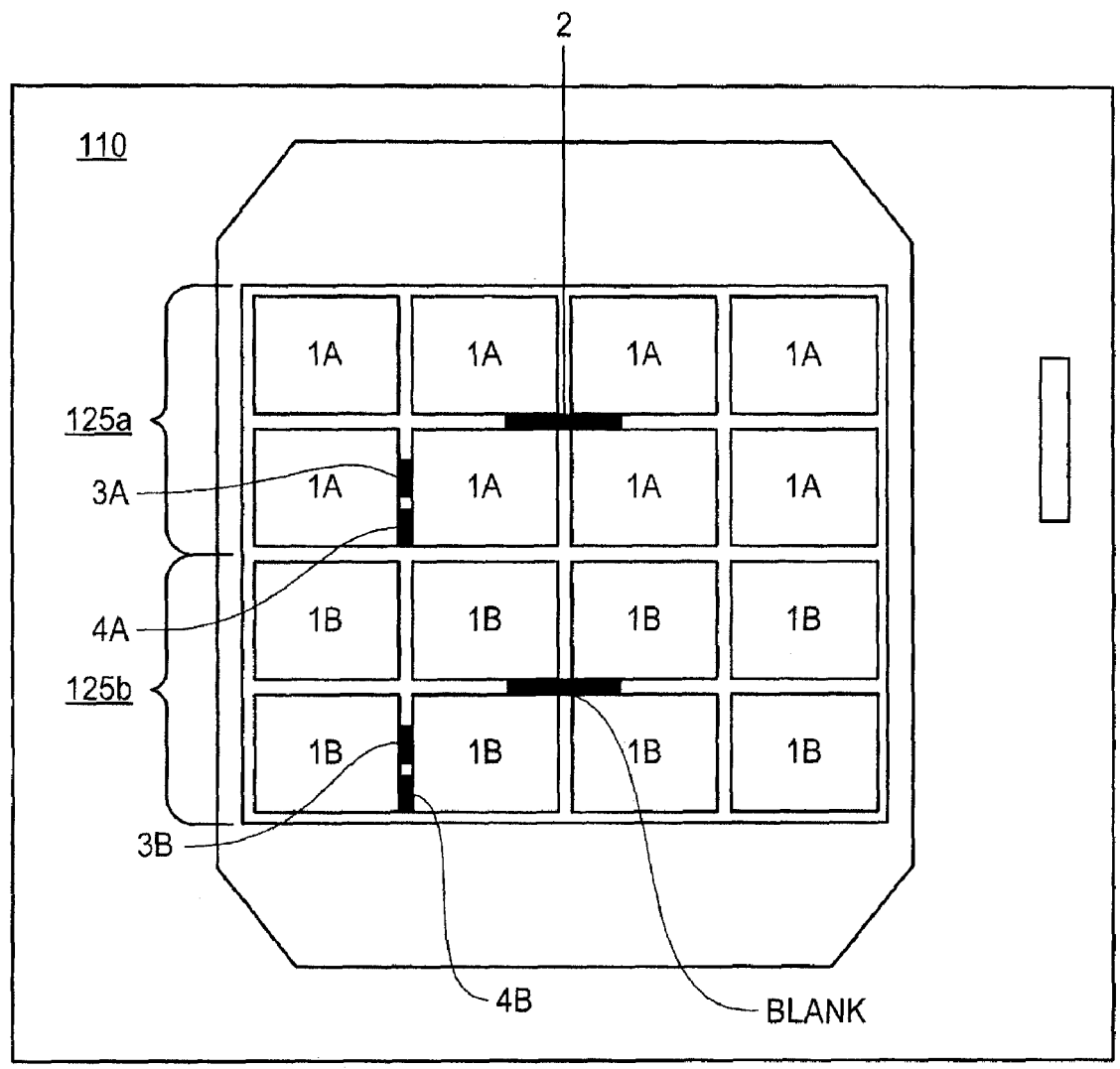
FIG. 4 depicts the two sub-arrays of FIG. 3 printed onto a single reticle, in accordance with an embodiment.

FIG. 3 depicts two sub-arrays 125*a*, 125*b* that can be merged to form the framework of a single reticle that is used for double patterning, in accordance with an embodiment. FIG. 4 depicts the two sub-arrays 125*a*, 125*b* printed onto a single reticle 110, in accordance with an embodiment. The reticle 110 of FIG. 4 can be used to form the same array of circuits as the reticle 210 in FIG. 2. Note, however, that some of the elements in the scribe lines might be located in different positions as compared to the original reticle 210. Each of the 2×4 sub-array 125*a*, 125*b* is exposed to the same location on the wafer in a separate step, such that the superposition of the two sub-arrays 125*a*, 125*b* results in double patterning.

Referring again to FIG. 3, the sub-arrays 125*a*, 125*b* are configured such that some elements in the scribe lines can be double patterned, whereas other elements in the scribe lines are not double patterned. Herein, elements 2, 3, 4 located in the scribe lines will be referred to as "in-scribe elements" or "in-scribe structures". In this example, element 3A in sub array 125*a* and element 3B in sub array 125*b* are used for double patterning. Likewise through the use of controlled exposure, element 4A and element 4B can be used for double patterning. As a particular example, electrical test structures could be fabricated in the wafer scribe line by double patterning. These test structures might have a density that is similar to the circuits formed by portions 1A and 1B, which are also double patterned. However, it is not required that the in-scribe elements to be double patterned are electrical test structures. Furthermore, it is not required that all electrical test structures be double patterned.

Other in-scribe elements are not double patterned. As an example, process control marks in the scribe lines might not need to be double patterned. Examples of process control marks include, but are not limited to, optical alignment marks, registration marks, focus marks, and line width control marks. However, it is not required that the in-scribe elements that are not to be double patterned are process control marks, such as optical alignment marks.

Moreover, it is not a requirement that the elements that are not to be double patterned are in-scribe elements. For example, it may be that a portion of, or an entire die area is not to be double patterned.

Note that the test structure patterns 3, 4, as well as the process control patterns 2 can be located in different positions relative to where they were in the original design of FIG. 2. For example, in FIG. 2, the process control pattern 2 is located in a different row than the process control pattern 2 of FIG. 4. Also note that because patterns such as the test structure patterns 3, 4 may be split such that they may be double patterned, there may be additional patterns in the reticle. For example, the reticle of FIG. 4 has twice as many test structure patterns 3, 4 as does the reticle of FIG. 2.

Furthermore, note that in some cases a pattern may need to be moved to accommodate a split portion of another pattern. For example, the top sub-array might have had a pattern at the position at which pattern 3A was added. In one embodiment, suitable locations for the patterns within the scribe lines are determined. Note that in some cases, the overall area of the scribe lines might be increased to accommodate the patterns. In one embodiment, a determination is made as to how much area is needed for the scribe line patterns and scribe lines are widened, if necessary.

Example Shot Patterns

Figure 5:
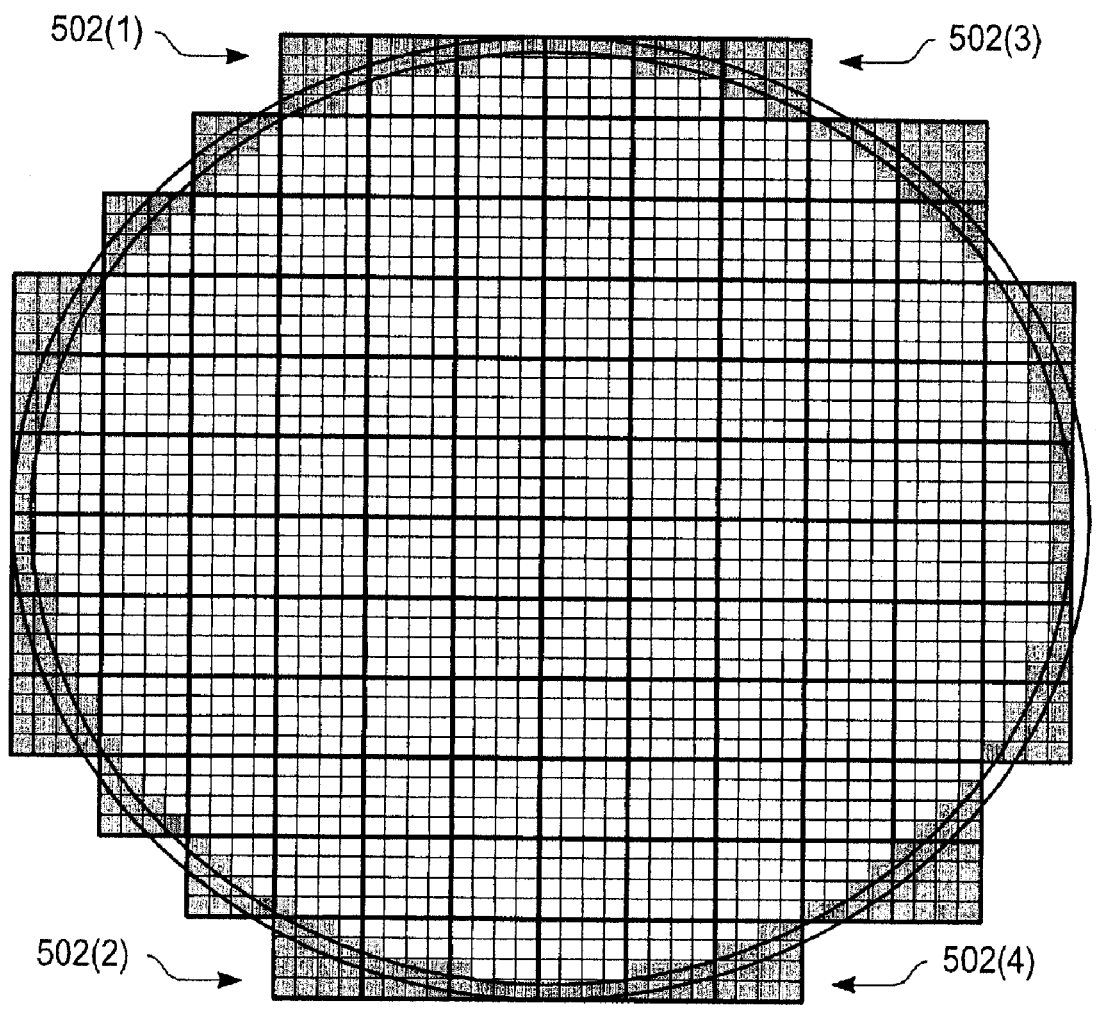
FIG. 5 shows the stepping of a full array onto the wafer during the first phase of a double patterning process, in accordance with an embodiment.
Figure 6:
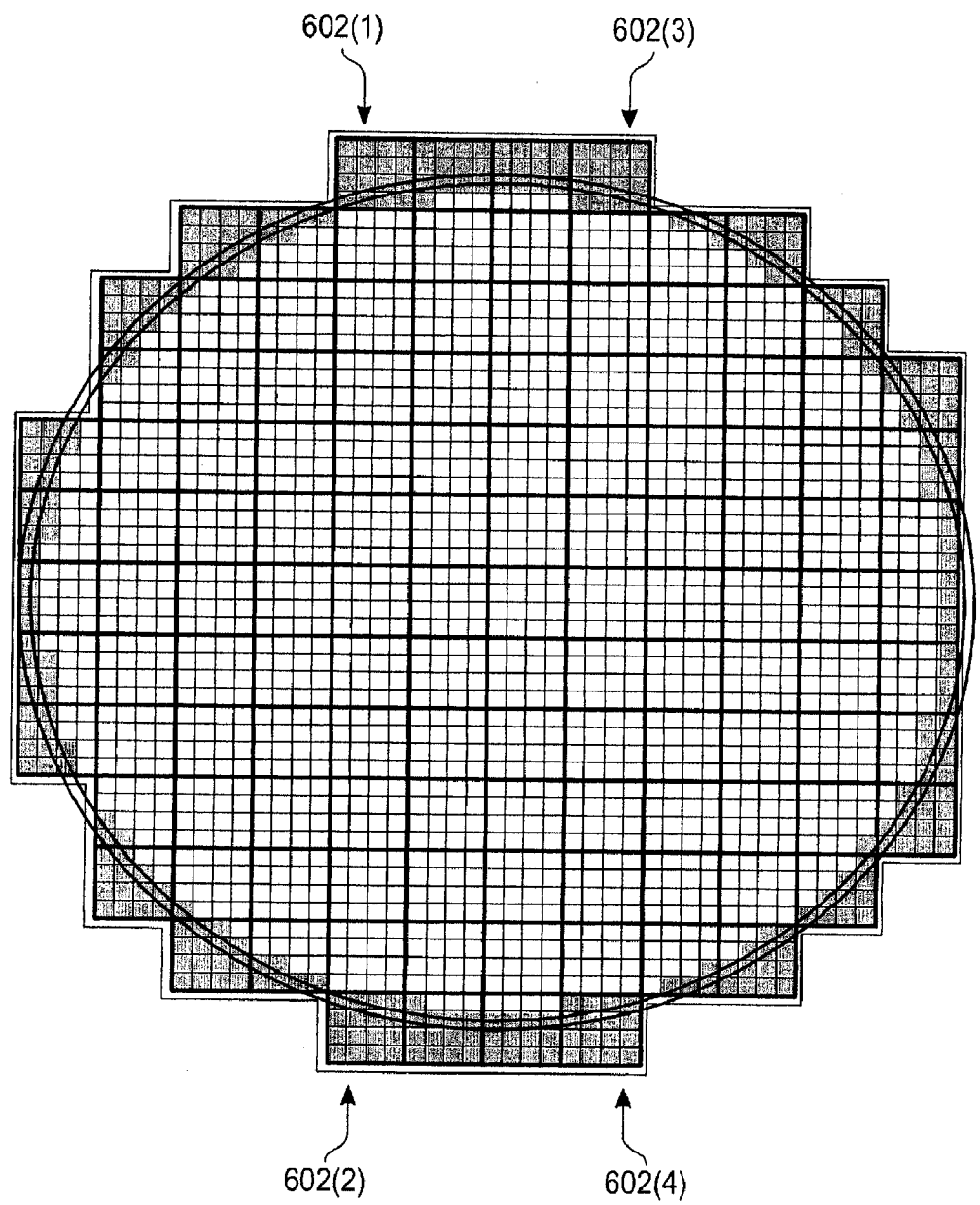
FIG. 6 shows the stepping of the full array onto the wafer during a second phase of the double patterning process, in accordance with an embodiment.
Figure 7:
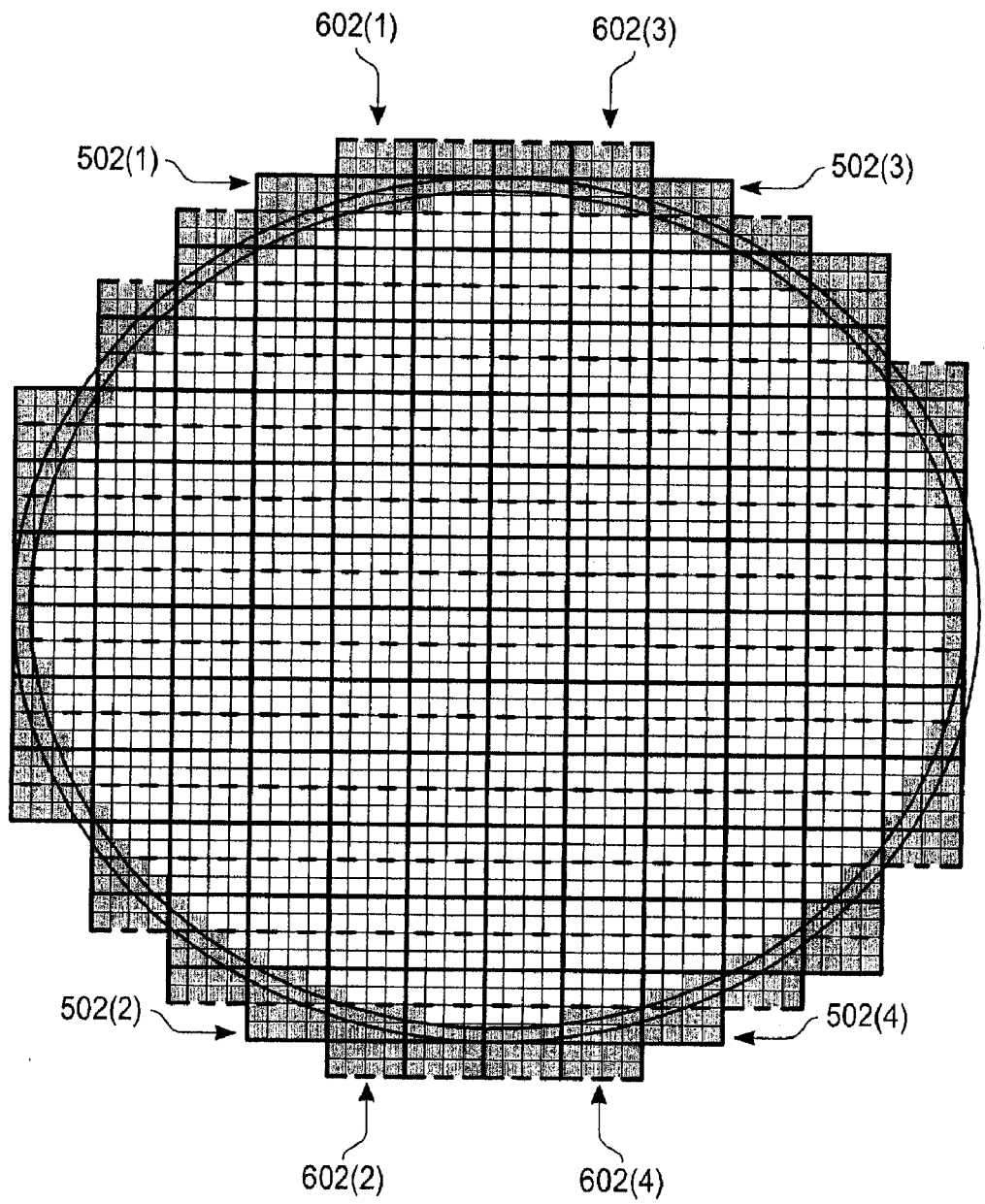
FIG. 7 shows both wafer maps of FIG. 5 and FIG. 6 as they will be merged on the wafer to achieve the double patterning, in accordance with an embodiment.

FIGS. 5-7 are used to illustrate example wafer shot patterns, in accordance with an embodiment. FIG. 5 shows the stepping of the full array onto the wafer during the first phase of the double patterning process, in accordance with an embodiment. By the full array it is meant all of the sub arrays in the reticle. Referring to FIG. 4, this would be sub arrays 125*a* and 125*b*. Note that the full array would have three sub arrays in the event that triple patterning is used. Further note that the pattern in FIG. 5 may be the same wafer map that would have been used had double patterning not been required. Several 4×4 die arrays 502(1)-502(4) have been identified for reference purposes.

FIG. 6 shows the stepping of the full array onto the wafer during the second phase of the double patterning process, in accordance with an embodiment. The frame stepped on the wafer in FIG. 6 is shifted by two dice in the vertical axis relative to the frame stepped on the wafer in FIG. 5. Several 4×4 die arrays 602(1)-602(4) have been identified for reference purposes. Also note that more shots may be used in the second phase than the first phase. For example, there may be more shots per column in the second phase.

The result of the second step is to merge the split patterns on the wafer in order to achieve the double patterning. FIG. 7 shows both wafer maps as they will be merged on the wafer to achieve the double patterning, in accordance with an embodiment. The dashed horizontal lines indicate the vertical position of the second wafer shots. Herein, this merging may be referred to as "superposition" of the two patterns.

Process Flow for Constructing a Reticle in Accordance with an Embodiment

Figure 8:
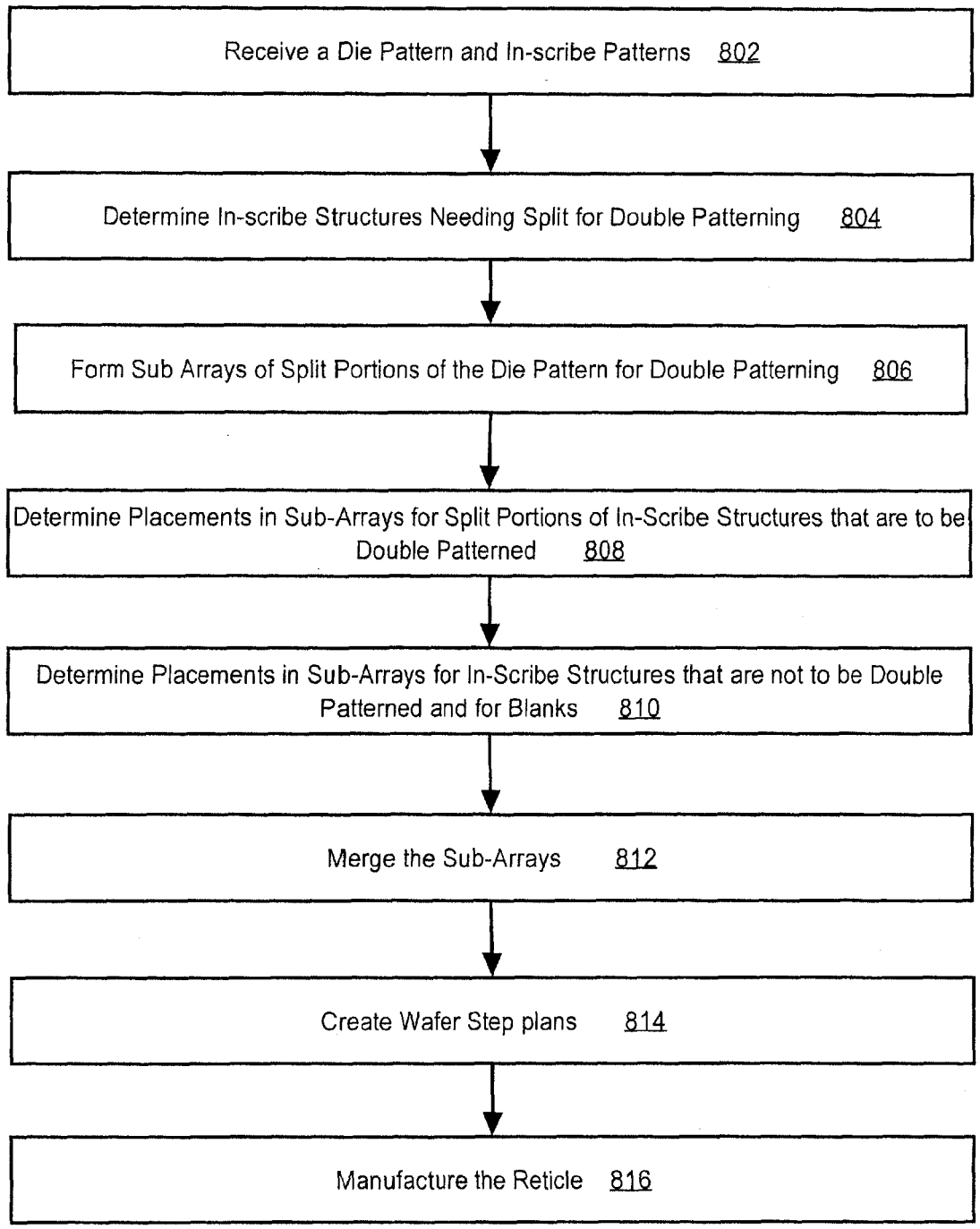
FIG. 8 depicts a flowchart illustrating a process of forming a reticle, in accordance with an embodiment.

FIG. 8 depicts a flowchart illustrating a process 800 of constructing a reticle, in accordance with an embodiment. Process 800 is described in a given order for convenience of explanation; however, it is not required that this order be used.

Moreover, process 800 may be iterative in that some blocks are repeated until a suitable solution is found. In block 802, a die pattern and in-scribe patterns are received. The die pattern may describe a layer of an integrated circuit. The in-scribe patterns may be provided by a user identifying electrical test structures and process control structures in a library of parts. In block 802, suitable array dimensions may be determined for an array that is not to be used for double patterning. The array dimensions can include number of dice in an array, size of each die, and width of scribe lines. For example, suitable array dimensions are determined for the die array of the reticle of FIG. 2. Suitable array size calculation and suitable scribe size calculation can be performed with an automated reticle design tool, such as MaskCompose™ automated reticle design tool, which is commercially available from Cadence Design Systems, Inc. of San Jose, Calif.

In block 804, in-scribe structures that are to be split for double patterning are determined. In one embodiment, the determination is made by identifying which in-scribe structures have been marked as needing double patterning. For example, a user could mark (e.g., tag) the in-scribe structures accordingly. However, it is not required that the determination be based on user input. In one embodiment, the determination for splitting is based on the type of in-scribe structure. For example, electrical test structures are split, but process control marks are not split. However, the determination could also be based on an analysis of the pitch of in-scribe structures. That is, structures having a pitch that is more narrow than a threshold could split.

In block 806, a first and a second sub-array of the split portions of the die pattern and in-scribe structures are formed. In one embodiment, the patterns that were received in block 802 are split into two portions for double patterning, based on an analysis of the features of the patterns. For example, referring to FIG. 1, an original pattern 102 is split into two portions 1A, 1B. In another embodiment, the split portions are provided in block 802.

Block 806 may include modifying the sub-array dimensions from block 802 to allow sub-arraying for a reticle that is to be used for double patterning. For example, dice per array, dimension of each die, and scribe line widths are determined for the sub arrays of FIG. 3. In the example of FIG. 3, the sub-arrays are four dice wide, which corresponds to the width of the original design in FIG. 2. However, this may not always be the case. For example, it may be that the vertical scribe lines are made wider to accommodate the in-scribe structures, which might result in using fewer dice or a smaller size for each die. The horizontal scribe lines could also be made wider, thus affecting the number of vertical dice and/or vertical die size. Suitable array size calculation and suitable scribe line width calculation can be performed with an automated reticle design tool. An allowed range of scribe lines widths may be input to the reticle design tool. Block 806 may be repeated one or more times, based on the outcome of later blocks. However, after repeating block 806 it is not required that all of the blocks following block 806 be repeated.

In block 808, placements, in the first sub-array and the second sub-array, are determined for split versions of the in-scribe patterns that are to be double patterned. In block 810, for each particular in-scribe pattern that is not to be double patterned, a placement is determined in either the first sub-array or the second sub-array for the particular pattern and position for a blank in the other of the first sub-array or the second sub-array. Thus, after completing block 810, non-uniform sub-arrays have been generated.

In block 812, the sub-arrays are merged to form a juxtaposed framework that can be used to print the reticle. For example, the framework for the reticle of FIG. 4 is created. Block 812 does not refer to the actual fabrication of the reticle, which occurs later. Note that the geometries of the patterns for the various in-scribe structures may be described by separate data files. For example, there may be a library of patterns for electrical test structures and a library of patterns for process control structures. Moreover, there may be one or more files that describe the die pattern for the circuit. In order to print all of the information onto the reticle, the data from all of the files are merged together in block 812.

Note that when merging occurs, some scribe lines may overlap with others. For example, referring to FIG. 3, the bottom scribe line 315a of sub-array 125a will overlap with the top scribe line 315b of sub-array 125b in the final reticle of FIG. 4. Moreover, when the reticle is used for double patterning, the top scribe line 315c of sub-array 125a will be exposed to the same target region as the bottom scribe line 315d of sub-array 125b. Thus, in-scribe structures in one sub-array may need to be moved from an initial placement to avoid a conflict with an in-scribe structure in a corresponding position in another sub-array. It may be that additional scribe space is required to locate all of the in-scribe structures, in which case block 806 may be repeated to modify the scribe widths (and possibly the number of dice per sub-array).

In block 814, wafer step plans are created. For example, a wafer step plan is created to achieve the pattern of FIG. 5. This plan may seek to reduce the number of wafer shots that are required. Moreover, a wafer step plan is created for the second step of the double patterning. For example, a wafer step plan is created to achieve the pattern of FIG. 6.

In block 816, the reticle is manufactured. Because only a single reticle is used for double pattering, overlay problems associated with using two reticles to double pattern are avoided.

Figure 9:
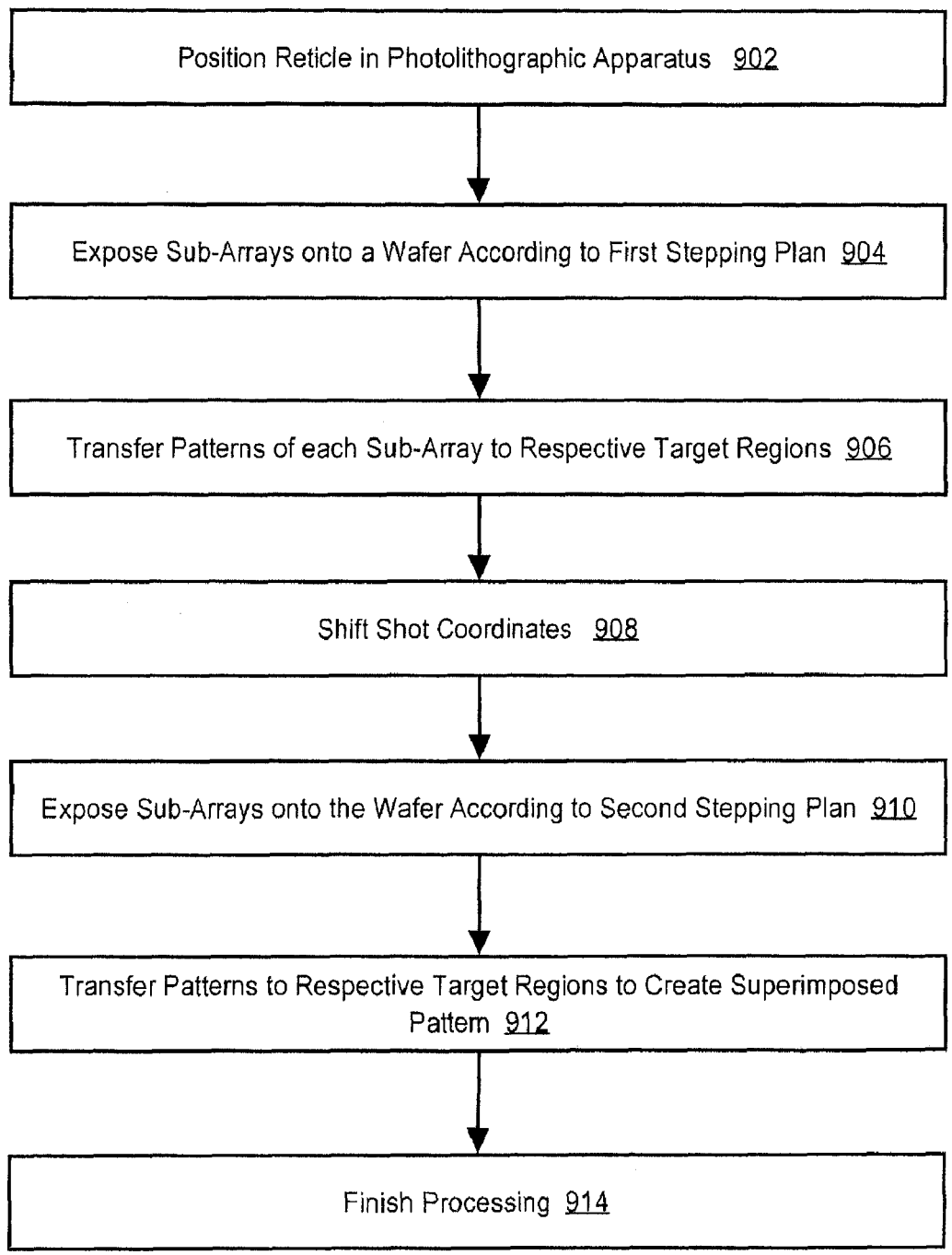
FIG. 9 is flowchart illustrating an overview of a process of double patterning using a single reticle, in accordance with an embodiment of the present invention.

Process Flow Having Simultaneous Exposure of Multiple Portions in Accordance with an Embodiment FIG. 9 is flowchart illustrating an overview of a process 900 of double patterning using a single reticle 110, in accordance with an embodiment of the present invention. In this embodiment, each portion of the pattern is simultaneously exposed to a different target region to be patterned. The example reticle 110 depicted in FIG. 4 will be used to explain process 900. However, process 900 is not limited to this example reticle 110. FIGS. 5, 6 and 7, which are diagrams depicting wafer step plans, will also be used to explain process 900. In block 902, the reticle 110 is placed into a lithographic apparatus.

In block 904, each sub-array 125a, 125b is exposed onto a photoresist, but to different target regions. Exposing each sub-array can be achieved with a single "shot". However, multiple shots can be made with a stepper or a scanner to expose the portions to additional target regions of the wafer. Each target region is used to form a separate chip, in one embodiment. For example, referring to FIG. 5, many shots are made on the wafer, with each shot exposing one instance of sub-array 125a and one instance of sub-array 125b to the photoresist.

Note that exposing at least one instance of sub-array 125a and at least one instance of sub-array 125b, which are part of a single reticle 110, with a single shot allows for better shot throughput than if sub-array 125a and sub-array 125b were exposed separately. For example, if one sub-array were bladed while the other was exposed, the throughput would be reduced.

In block 906, each portion of the pattern is transferred from the photoresist to one of the target regions of the material to be patterned. For example, a hard mask is etched to transfer the pattern of each sub-array 125a and each sub-array 125b to different target regions of a hard mask. Then, the photoresist is stripped and a new photoresist is spun on the wafer 330.

In block 908, shot coordinates are shifted to allow for sub-array 125a to be exposed in the target regions where sub-array 125b was exposed in block 904. This shift also results in sub-array 125b being aligned to be exposed where sub-array 125a was exposed in block 904.

In block 910, each sub-array 125a, 125b is exposed onto the newly spun on photoresist. FIG. 6 depicts the locations of those many shots, with each shot comprising one instance of sub-array 125a and one instance of sub-array 125b. FIG. 7 depicts the combined results.

In block 912, the pattern that was exposed in block 910 is transferred from the photoresist to the target regions (e.g., hard mask). Then, the photoresist is stripped away. In block 914, further processing is performed. For example, the pattern is transferred from the hard mask to the wafer. Note that the reticle 110 may be kept in place on the mask table throughout process 900.

Example Lithographic System

Figure 11:
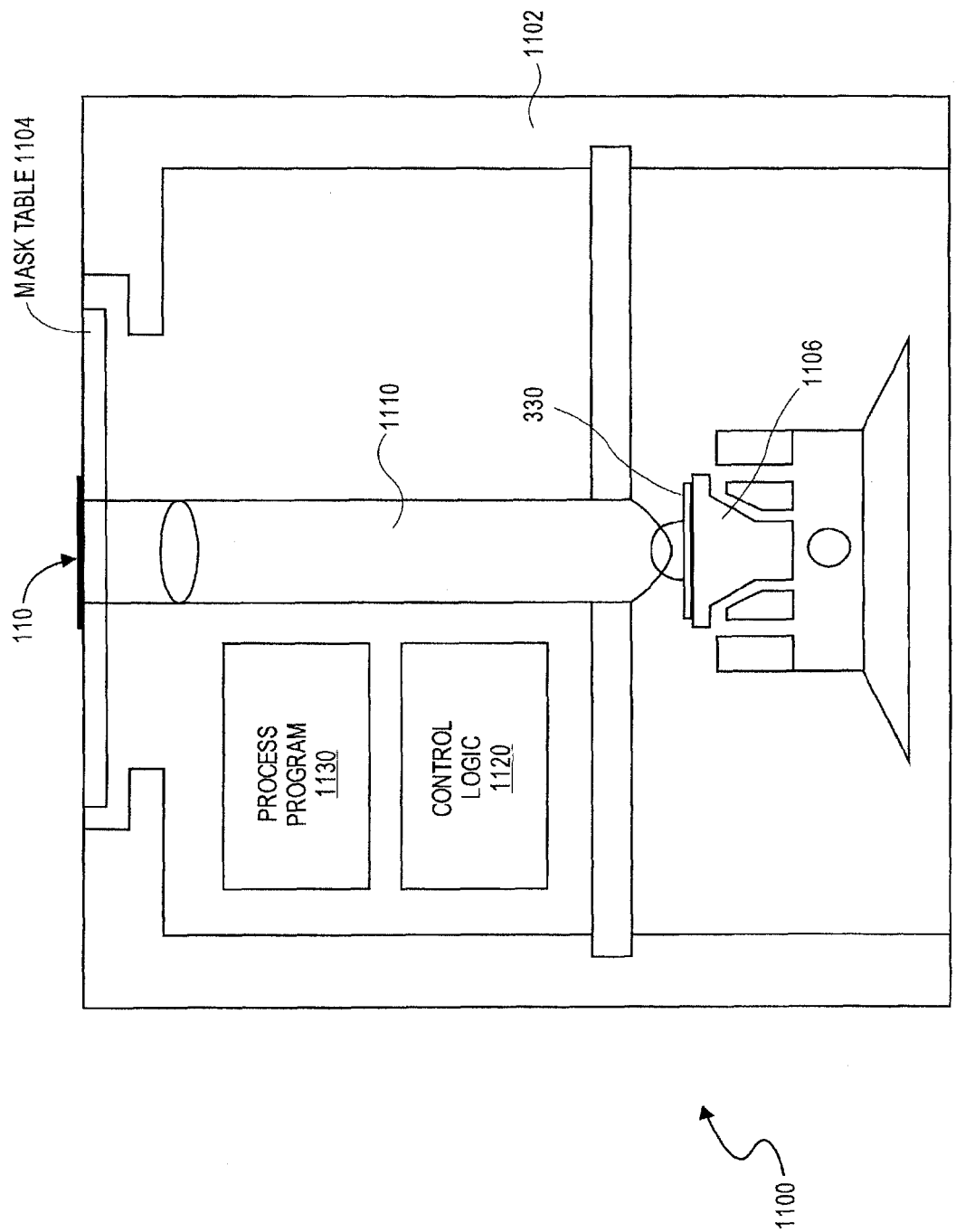
FIG. 11 is an example lithographic system, in accordance with an embodiment of the present invention.

FIG. 11 is an example lithographic system 1100, in accordance with an embodiment of the present invention. The lithographic system 1100 includes a lithographic apparatus 1102 having a mask table 1104, a wafer table 1106, a projection system 1110, and control logic 1120. The system 1100 includes a reticle 110 positioned on the mask table 1104 and a wafer 330 positioned on the wafer table 1106. The wafer 330 includes a material to be patterned by the reticle 110. The projection system 1110 is used to expose at least a portion of the reticle 110 onto one or more target regions of the wafer 330.

In one embodiment, the lithographic apparatus 1102 is capable of being operated in a stepper mode in which whatever portion of the pattern is to be exposed to the wafer 330 is exposed in a single step. In another embodiment, the lithographic apparatus 1102 is capable of being operated in a scanning mode in which whatever portion of the pattern is to be exposed to the wafer 330 is exposed by progressive scanning. In progressive scanning the mask table 1104 and the wafer table 1106 are moved in opposite directions, in an embodiment.

The process program 1130 stores instructions for processing the wafer 330. The control logic 1120 reads the process program 1130 and controls exposure of appropriate portions of the reticle 110 onto appropriate target regions of the wafer 330 to achieve double patterning.

In the embodiment described in process 900 a separate photoresist is used for each stepping plan. Such a technique may be referred to as "double exposure-double etch". In another embodiment, only a single photoresist is used in a double exposure-single etch embodiment, which may be referred to as "double exposure-single etch". In these embodiments, the second portion of the pattern is exposed on the single photoresist prior to etching the target region and removing the photoresist. Thus, the single photoresist has the pattern with the interleaved features of the first portion and second portion. Then, the pattern may be transferred from the photoresist to the target region.

Other Lithography Processes

While many examples herein have been directed to fabrication of a semiconductor wafers, the present invention is not so limited. Other examples of where double patterning using a single reticle can be applied include, but are not limited to, LCD panel lithography, lithography for a ceramic substrate, and lithography for a flexible substrate.

Hardware Overview

Figure 10:
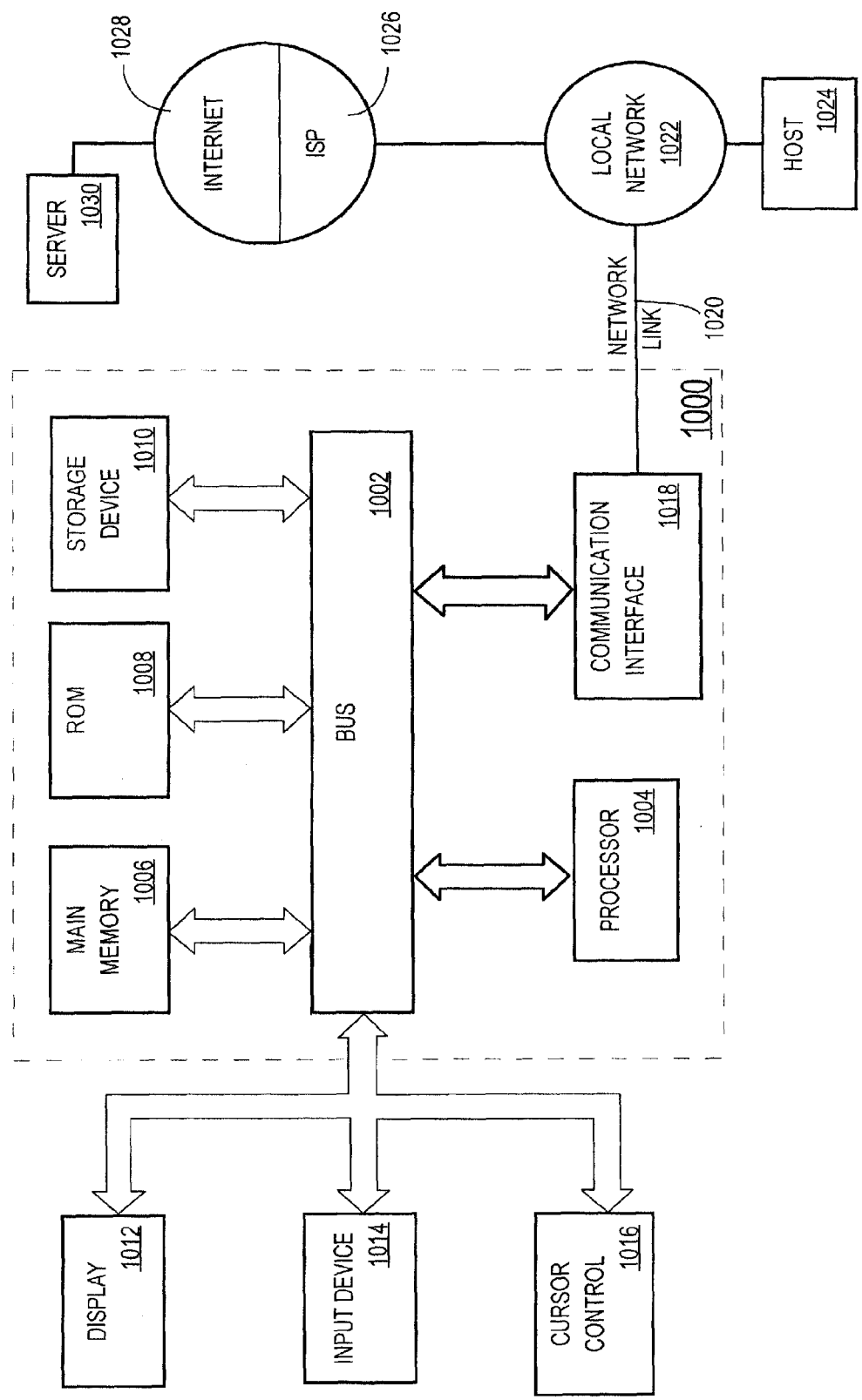
FIG. 10 is an example computer system upon which an embodiment of the present invention may be practiced.

FIG. 10 is a block diagram that illustrates a computer system 1000 upon which an embodiment of the invention may be implemented. Computer system 1000 includes a bus 1002 or other communication mechanism for communicating information, and a processor 1004 coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

The invention is related to the use of computer system 1000 for implementing the techniques described herein. According to one embodiment of the invention, those techniques are performed by computer system 1000 in response to processor 1004 executing one or more sequences of one or more instructions contained in main memory 1006. Such instructions may be read into main memory 1006 from another machine-readable medium, such as storage device 1010. Execution of the sequences of instructions contained in main memory 1006 causes processor 1004 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 1000, various machine-readable media are involved, for example, in providing instructions to processor 1004 for execution. Such a medium may take many forms, including but not limited to storage media and transmission media. Storage media includes both non-volatile media and volatile media. Non-volatile media includes, for example, optical or magnetic disks, such as storage device 1010. Volatile media includes dynamic memory, such as main memory 1006. Transmission media includes coaxial cables, copper wire and fiber optics, including the wires that comprise bus 1002. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, an EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 1004 for execution. For example, the instructions may initially be carried on a magnetic disk of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018.

The received code may be executed by processor 1004 as it is received, and/or stored in storage device 1010, or other non-volatile storage for later execution. In this manner, computer system 1000 may obtain application code in the form of a carrier wave.

Extensions and Alternatives

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

Alternative embodiments of the invention are described throughout the foregoing specification, and in locations that best facilitate understanding the context of the embodiments. Furthermore, the invention has been described with reference to specific embodiments thereof. It will, however, be evident that various modifications and changes may be made thereto without departing from the broader spirit and scope of the invention.

In addition, in this description certain process acts are set forth in a particular order, and alphabetic and alphanumeric labels may be used to identify certain acts. Unless specifically stated in the description, embodiments of the invention are not necessarily limited to any particular order of carrying out such acts. In particular, the labels are used merely for convenient identification of acts, and are not intended to specify or require a particular order of carrying out such acts.

What is claimed is:

1. A method comprising:
   receiving, by a lithographic apparatus, a die pattern and in-scribe patterns, wherein the die pattern has a first portion and a second portion for double patterning;
   determining which of the in-scribe patterns are to be double patterned;
   forming a first sub-array comprising a plurality of the first portions and a second sub-array comprising a plurality of the second portions;
   determining placements in the first sub-array and the second sub-array for split versions of the in-scribe patterns that are to be double patterned; and
   for each of the in-scribe patterns that is not to be double patterned, determining a placement in either the first sub-array or the second sub-array for the each of the in-scribe patterns and position for a blank in the other of the first sub-array or the second sub-array, wherein the blank is positioned to prevent a target region that is exposed to the each of the in-scribe patterns during a first part of the double patterning from being exposed during a second part of the double patterning; and
   merging the first sub-array and the second sub-array to generate a file for printing a reticle.

2. A method of claim 1, wherein determining which of the in-scribe patterns are to be double patterned is based on user input that identifies which of the in-scribe patterns are to be double patterned.

3. The method of claim 1, wherein determining which of the in-scribe patterns are to be double patterned is performed automatically based on features of the in-scribe patterns.

4. The method of claim 1, wherein determining which of the in-scribe patterns are to be double patterned is performed automatically based on type of each of the in-scribe patterns.

5. The method of claim 1, wherein determining which of the in-scribe patterns are to be double patterned includes automatically determining that an electrical test structure is to be double patterned.

6. The method of claim 1, wherein determining which of the in-scribe patterns are to be double patterned includes automatically determining that an optical mark is not to be double patterned.

7. The method of claim 1, wherein determining placements includes determining a new placement for an in-scribe pattern in order to avoid a conflict with an in-scribe pattern that is placed in a corresponding position in another sub-array.

* * * * *